US009619595B2

United States Patent
Nirmaier et al.

(10) Patent No.: US 9,619,595 B2
(45) Date of Patent: Apr. 11, 2017

(54) GENERATION OF TEST STIMULI

(71) Applicant: Infineon Technologies AG, Neubiberg (DE)

(72) Inventors: Thomas Nirmaier, Munich (DE); Georg Pelz, Ebersberg (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 14/220,555

(22) Filed: Mar. 20, 2014

(65) Prior Publication Data

US 2015/0269294 A1 Sep. 24, 2015

(51) Int. Cl.
  *G06F 9/455* (2006.01)
  *G06F 17/50* (2006.01)
  *G01R 31/3183* (2006.01)

(52) U.S. Cl.
  CPC . *G06F 17/5022* (2013.01); *G01R 31/318364* (2013.01); *G06F 17/5081* (2013.01)

(58) Field of Classification Search
  USPC .......................................................... 716/106
  See application file for complete search history.

(56) References Cited

U.S. PATENT DOCUMENTS

2007/0150845 A1* 6/2007 Matsuura ......... G01R 31/31831
                                                        716/103
2011/0144819 A1* 6/2011 Andrews et al. ............. 700/291
2011/0145653 A1* 6/2011 Broadfoot ........... G06F 11/3604
                                                        714/38.1
2012/0011481 A1* 1/2012 Dwivedi et al. ............. 716/109
2013/0018692 A1* 1/2013 Guo et al. .................... 705/7.25

OTHER PUBLICATIONS

Nirmaier, T. et al., "Robustness Metrics for Automotive Power Microelectronics," 1st RIIF Workshop @ DATE 13, DATE Conference, published Mar. 22, 2013, 8 pp.
Nirmaier, T. et al., "Measuring and Improving the Robustness of Automotive Smart Power Microelectronics," DATE Conference 2012, published Mar. 12, 2012, 2 pp.
"k-means clustering," In Wikipedia, The Free Encyclopedia, retrieved from http://en.wikipedia.org/wiki/K-means_clustering on Mar. 10, 2014, 12 pp.
"Markov process," In Wikipedia, The Free Encyclopedia, retrieved from http://en.wikipedia.org/wiki/Markov_process on Mar. 10, 2014, 4 pp.
"DBSCAN," In Wikipedia, The Free Encyclopedia, retrieved from http://en.wikipedia.org/wiki/DBSCAN on Mar. 3, 2014, 5 pp.
"Expectation-maximization algorithm," In Wikipedia, The Free Encyclopedia, retrieved from http://en.wikipedia.org/wiki/Expectation-maximization_algorithm on Mar. 3, 2014, 11 pp.

* cited by examiner

*Primary Examiner* — Bryce Aisaka
(74) *Attorney, Agent, or Firm* — Shumaker & Sieffert, P.A.

(57) ABSTRACT

Methods and apparatuses related to the generation of test stimuli are described. In some embodiments, a finite state machine is generated based on a mission profile, and test stimuli are generated based on the mission profile.

22 Claims, 6 Drawing Sheets

GENERATION OF TEST STIMULI

TECHNICAL FIELD

The present application relates to the generation of test stimuli usable for testing devices, for example semiconductor circuit designs, semiconductor devices or systems.

BACKGROUND

During development and production of devices, for example integrated circuits, systems or other semiconductor devices, extensive tests are performed to ensure that the device meets desired specifications. For example, a semiconductor device may be tested using simulations prior to actually implementing the semiconductor device, and later in the development process, for example prototypes, i.e. actual implementations of the semiconductor device, may be tested using corresponding test equipment.

For many of such tests, so-called test stimuli are needed, which correspond to signals, e.g. transient signals, or other parameters applied to the semiconductor device to test the behaviour of the semiconductor device, for example by simulation or in reality. Conventionally, such test stimuli may be generated based on a simple specification of the semiconductor device. Such a simple specification may for example define maximum and/or minimum operation parameters for the semiconductor device, like minimum and/or maximum currents, minimum and/or maximum temperatures, voltage ranges or any other parameters the semiconductor device may be exposed to during its intended use.

However, tests based simply on maximum and/or minimum values of a parameter may lead to device designs which are unnecessarily large in some circumstances. For example, when a specified maximum temperature for a device is 150° C., the device design using the above approach may lead to a semiconductor device which may be able to operate at 150° C. for a long time. On the other hand, in an actual use of the device in some applications, the temperature may reach for example 150° C. only sometimes for very short periods of time and may be much lower the rest of the time. For such an application scenario, a less temperature-robust design than for an operation which is permanently at a high temperature, may be sufficient.

DETAILED DESCRIPTION

In the following, various embodiments will be described in detail with reference to the attached drawings. It should be noted that these embodiments serve illustrative purposes only and are not to be construed as limiting the scope of the present application in any way. For example, while embodiments may be described as comprising a plurality of features or elements, in other embodiments some of these features or elements may be omitted and/or be replaced by alternative features or elements. In other embodiments, additionally or alternatively additional features or elements may be present. Furthermore, features or elements from different embodiments may be combined to form further embodiments.

In some embodiments, stimuli for testing a semiconductor device are generated based on mission profiles. In some embodiments, for this generation a finite state machine (FSM) is generated based on the mission profile, and then stimuli are generated based on the finite state machine.

A finite state machine, as used herein, may refer to a structure comprising a plurality of states and transition probabilities between the states. Such a structure may for example be stored in a memory.

A mission profile is a set of data describing one or more parameters that may act on a semiconductor device in actual use in a way that goes beyond giving simple minimum and maximum values. For example, probabilities for certain parameter values or correlations between parameters may be described. To illustrate this further, some simple examples for mission profiles will now be explained with reference to FIGS. 1A to 1C.

Figure 1A:
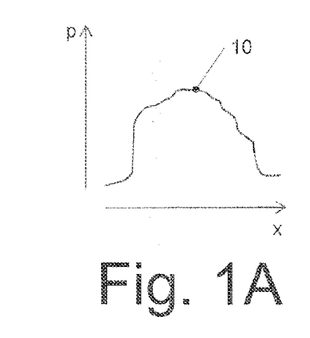
FIGS. 1A to 1C illustrate examples for mission profiles.

In FIG. 1A, a curve 10 shows a probability p for the occurrence of the specific value of a parameter x. For semiconductor devices, x may for example be a temperature, a voltage, a current, a magnetic field, a quantity to be sensed by a semiconductor sensor etc. In the example of FIG. 1A, a probability p is higher in a middle range than at the ends of a range for parameter x. This provides more information than merely given a minimum and a maximum value for the parameter x. For example, curve 10 gives the information that extreme values (near the minimum or the maximum of x) occur comparatively rarely. While a single parameter x is shown in FIG. 1A, mission profiles may comprise probability distributions for a plurality of parameters.

Figure 1B:
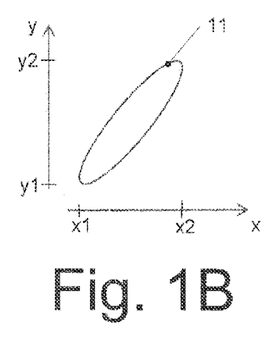

A further example for a mission profile is shown in FIG. 1B. In FIG. 1B, a curve 11 shows a correlation between two parameters x and y. Similar to FIG. 1A, x and y may for example be temperature, current, voltage or any other parameter relevant to the operation of a semiconductor device. For example, x may be a temperature, and y a current, just to give an example. In an example case, combinations of the parameters x and y may only occur in the area enclosed by curve 11. Also such a mission profile provides more information than simple minimum and maximum values. For example, while for the mission profile of FIG. 1B, a minimum value for x may be x1 and a maximum value x2, and a minimum for y may be y1 and a maximum value y2, the mission profile additionally includes the information that only certain combinations of these parameters may occur. For example, a combination (x1,y2) or a combination (y1,x2) may not occur in the example of FIG. 1B. Therefore, as will be explained later in some more detail, such combinations need not be tested and the semiconductor device need not be defined to cope with such combinations of parameters. While a correlation between two parameters is shown in FIG. 1B, corresponding to a 2-dimensional correlation, such correlations may also involve more than two parameters, corresponding to an n-dimensional correlation with n>2.

Figure 1C:
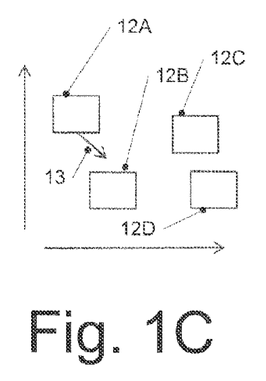

A further possibility for mission profiles is illustrated in FIG. 1C. Here, the mission profile comprises a plurality of states 12B to 12D. For example, such states may comprise an active state of a semiconductor device, a switched-off state of the semiconductor device, a sleep-state of the semiconductor device (i.e. a state with reduced fuel consumption) etc. For example, in the automotive field, a sleep-state may be used when the engine is automatically turned off at traffic lights or other stops, which is a feature implemented in many modern cars. In another example, states in the state machine of FIG. 1C may include states of a driving cycle like stop, accelerate, cruise, brake and off. Depending on the state, different voltages, currents etc. may be applied to a device like a semiconductor device. The mission profile then may comprise information regarding the probability of the various states (somewhat similar to FIG. 1A), and/or information regarding the transition between states (as indicated by an arrow 13), for example information regarding a probability of transition. While four states are shown in FIG. 1C, this is merely to be taken as an illustrative example, and any number of states may be used.

Generally, the diagrams shown in FIGS. 1A to 1C serve merely to illustrate the concept of mission profiles and are not to be construed as limiting. Furthermore, mission profiles may comprise combinations of the possibilities discussed with reference to FIGS. 1A to 1C, for example for different parameters.

Such mission profiles may for example be provided by a direct or indirect customer of a manufacturer of a device like a semiconductor device, for example by an original equipment manufacturer (OEM) like a car manufacturer or by a company providing components for an OEM (e.g. tier-1 company), the components in turn needing devices like semiconductor devices. Such mission profiles may for example be provided based on actual measurements in a product where the device to be designed is to be employed. For example, when the device is to be used in a car, typical temperature distributions or other parameters during the use of the car may be measured and used to provide the mission profile.

In some embodiments, mission profiles may have a specific form, for example a hierarchical structured form. For example, a first layer of a mission profile may specify a core structure and different generic data structures like values, vectors or standard data types. A second layer may describe specific templates for environmental stresses or functional loads as well as hierarchically structured operating states. Operating states describe common and special application conditions for a product. For example, in case of a car or other vehicles, such conditions may be for example comprise a defrosting for a potentially frozen throttle valve which leads to a high current at very low temperatures, or a high load for a power assisting steering motor by steering against a curb.

A third layer may define extension points and mechanisms in order to add company-specific templates, data structures and data types. It may also provide elements to support encryption. However, the above structure serves merely as an example, and mission profiles may be provided in any desired manner, for example tables, graphs, distributions etc.

as long as required information, for example information as explained with reference to FIGS. 1A to 1C, is accessible.

It should be noted that the term "device" or "device under test (DUT)" in this context is not to be construed as necessarily meaning a single device, e.g. a semiconductor device, but may also refer to devices comprising a plurality of different components or different devices interacting with each other in the context of a system. In the following, for ease of explanation a semiconductor device may be used as an example. However, the disclosed techniques may also be applied to other devices.

In embodiments, as will be described below in greater detail, such mission profiles are used to generate stimuli for testing, verifying and/or validating devices like semiconductor devices, for example in the course of a simulation of the semiconductor device or for testing a real implementation of the semiconductor device. Such generation of stimuli using techniques as outlined below may be implemented in hardware, firmware, software or combinations thereof. For example, the techniques may be employed in software running on a computer, for example as a part of an EDA (Electronic Design Automation) program. However, techniques may also be implemented using functions provided in hardware or firmware. For simplicity's sake the stimuli will also be referred to as test stimuli hereinafter. However, the application of such test stimuli is not limiting to the testing of devices, but may also e.g. be used for verification and/or validation purposes.

Figure 2:
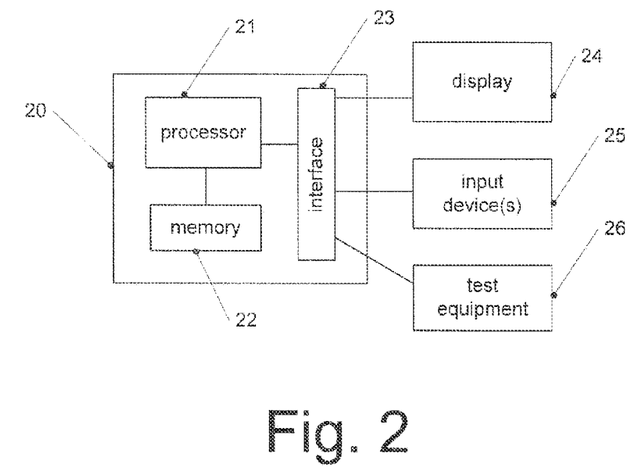
FIG. 2 is a block diagram illustrating an apparatus according to an embodiment.

In FIG. 2, a computing device, for example a computer, according to an embodiment which may implement the techniques describe the following as schematically shown. Computing device 20 comprises one or more processors 21, for example general purpose processors (GPU), auxiliary processors for specific functions or combinations thereof. For simplicity's sake, in the following description reference is merely made to "a" processor 21, keeping in mind that more than one processor may be present.

Processor 21 in the embodiment of FIG. 2 is coupled to a memory 22. Memory 22 may comprise random access memory (RAM), read only memory (ROM), flash memory, storage devices like hard disks or solid state disks and/or any other type of required memory. In memory 22, programmes may be stored which, when executed on processor 21, enable the generation of test stimuli based on mission profiles.

Processor 21 is further coupled to one or more interfaces 23 for interaction with the outside world. For example, interfaces 23 may be coupled with a display 24 and with one or more input devices 25 like a keyboard, a mouse, a trackball or also a network cable or a wireless network port over which data may be received. For example, via interface 23 a mission profile may be received. Further conventional components of computing devices like mass storage devices (hard disks, optical drives like DVD or CD drives etc.) may also be present. Furthermore, in some cases, interfaces 23 may be coupled with test equipment 26. Test equipment 26 may comprise conventional test equipment for testing, verifying and/or validating real devices, e.g. semiconductor devices. The term "real device" as used herein refers to an actual hardware implementation, in contrast to a simulated device which may for example be implemented as software. In embodiments, interface 23 may be used to output information regarding test stimuli generated on the basis of one or more mission profiles to test equipment 26. In other embodiments, such test stimuli may be used internally in computing device 20 to perform simulation tests of a device under test (DUT). In other embodiments, information regarding test stimuli may be stored on a data carrier or transmitted otherwise to a further computing device to perform simulations. In other words, functions and techniques described herein need not be implemented on a single computing device, but different acts, calculations or other activities described herein may also be performed on different computing devices.

Figure 3:
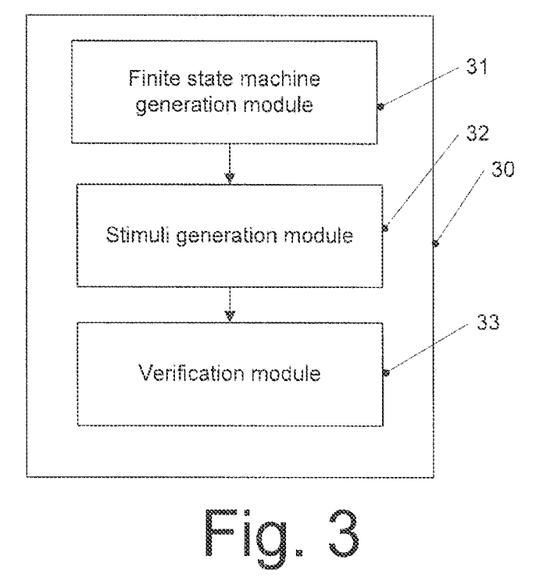
FIG. 3 is a block diagram illustrating an apparatus according to an embodiment.
Figure 4:
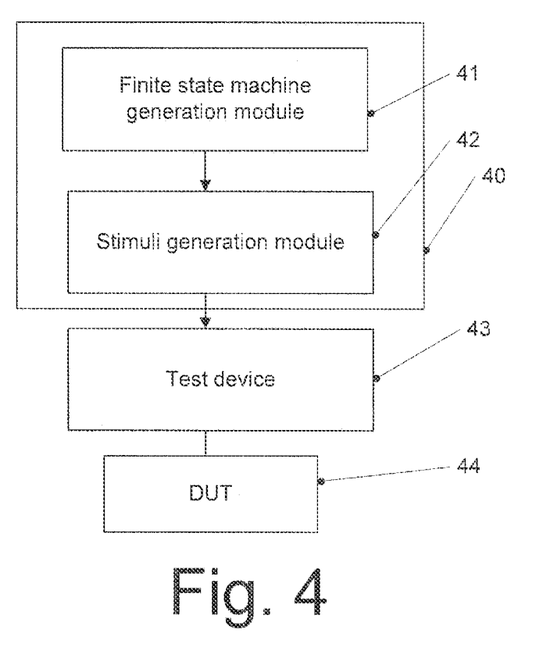
FIG. 4 is a block diagram illustrating an apparatus according to an embodiment.

In FIGS. 3 and 4, block diagrams of apparatuses involving the generation of test stimuli according to embodiments are shown. The embodiments of FIGS. 3 and 4 are described as comprising "modules". Such modules need not be physically separate entities, but may for example be software modules, for example different parts of a program, which run on a processor like processor 21 of FIG. 2 to perform desired functions.

An apparatus 30, which may for example be implemented of the embodiment of FIG. 3 comprises a finite state machine generation module 31. Finite state machine generation module 31, as will be explained in some more detail later, in operation receives a mission profile and generates a finite state machine based on the mission profile. The thus generated finite state machine is then used by a stimuli generation module 32 to generate test stimuli. The generated test stimuli may then be used by a verification or simulation module 33 to verify, validate and/or test a semiconductor device designed by simulation. While modules 31 to 33 are provided in a common apparatus 30 in FIG. 3, for example a common computer, they may also run on different computing devices, as mentioned above.

The result of the simulation 33 may then in some cases be used to optimize the semiconductor device design.

In the embodiment of FIG. 3, modules 31 to 33 may be implemented in software, although some hardware components may also be used, and a semiconductor device is tested, verified and/or validated using simulations or similar techniques. In other embodiments, generated stimuli may be used for testing of real devices. An apparatus according to such an embodiment is schematically shown in FIG. 4.

In the embodiment of FIG. 4, an apparatus 40, which for example may be implemented as a computing device like the device illustrated with respect to FIG. 2, comprises a finite state machine generation module 41 and a stimuli generation module 42. Modules 41, 42 may operate like modules 31, 32 of FIG. 3 and will therefore not be described again in greater detail.

In the embodiment of FIG. 4, the test stimuli generated by stimuli generation module 42 are forwarded to a test device 43, which applies the stimuli as real life signals to a device under test (DUT) 44 which in the embodiment of FIG. 4 is a real device. In this way, in the embodiment of FIG. 4 an actual hardware testing, verification and/or validation is performed.

Figure 5:
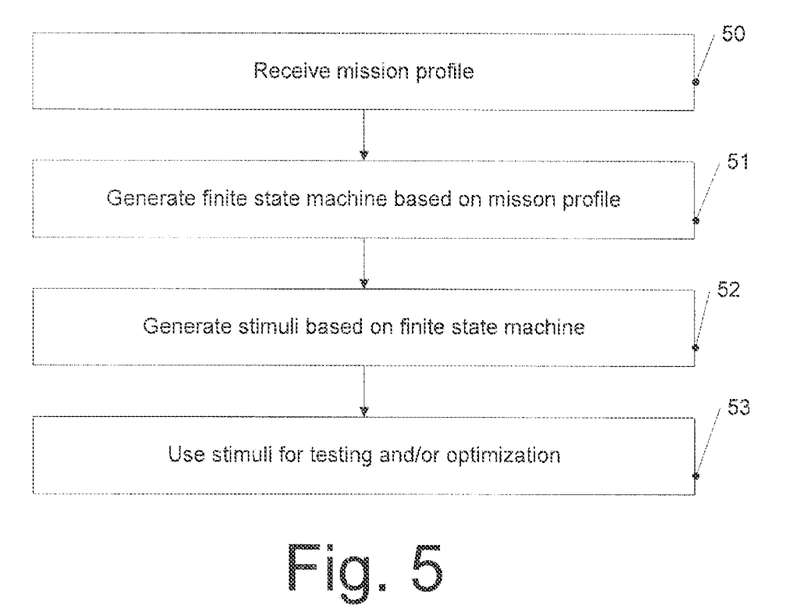
FIG. 5 is a flowchart illustrating a method according to an embodiment.

In FIG. 5, a flowchart illustrating a method according to an embodiment is shown. The method of FIG. 5 may for example be implemented using any of the devices discussed with reference to FIGS. 2-4, but may also be implemented in other ways using for example hardware, software, firmware or combinations thereof. In an embodiment, for example a computer-readable storage medium like an optical medium, a memory-based medium like a flash memory or a magnetic medium like a hard-disk may be provided comprising instructions stored thereon. When executed by one or more processors, for example in a computing device shown in FIG. 2, the instructions may cause the one or more processors to generate a finite state machine based on a mission profile for a device, and generate test stimuli for the device based on the finite state machine, for example as putlined below with reference to FIG. 5.

At 50, a mission profile is received or provided. The mission profile may comprise any type of mission profile, for example one of the mission profiles explained with reference to FIGS. 1A-1C above. The mission profile may for example be provided by an end user of a device, e.g. semiconductor device, to be manufactured, for example a OEM, or also by any intermediate level manufacturer (for example tier 1) in a manufacturing chain. The mission profile as explained above may comprise information regarding parameters like current, voltage, temperature, magnetic field or others during an intended use of a semiconductor that is to be designed or manufactured.

At 51, the embodiment of FIG. 5 comprises generating a finite state machine based on the mission profile. The finite state machine may comprise a plurality of states and transition probabilities between the states. Examples for generating a finite state machine based on a mission profile will be explained later with reference to FIGS. 6-8 in more detail.

Furthermore, at 52, the method of FIG. 5 comprises generating test stimuli, for example transient stimuli, based on the finite state machine. The test stimuli may for example be generated based on a stochastic process, for example a Markov process. For example, one of the states of the finite state machine may be used as a starting point, and then for example clocked by a suitable clock frequency the states may be changed based on transition probabilities between the states. At each state, for example a test signal value associated with respect to the respective state is used as a test stimulus, for example as a transient testing signal.

In other embodiments, instead of a stochastic process, a directed process, for example a process including state space counting, may be used. In some embodiments, generating a stimulus may also be coverage driven to achieve a certain target coverage of the mission profile received at 50. For example, the above-mentioned stochastic process may be performed until for example a distribution of the test signal approximates a distribution given by the mission profile with a desired accuracy.

At 53, in the embodiment of FIG. 5, the test stimuli generated at 52 are used for testing, verification, validation and/or optimization of a device, for example via simulation or via testing, verification and/or validation of an actual implementation of a device. For testing, any conventional testing equipment or any conventional testing simulations may be used.

In some embodiments, testing may comprise evaluating a robustness of a circuit design, and/or optimization may comprise optimizing a robustness of the design.

Figure 6:
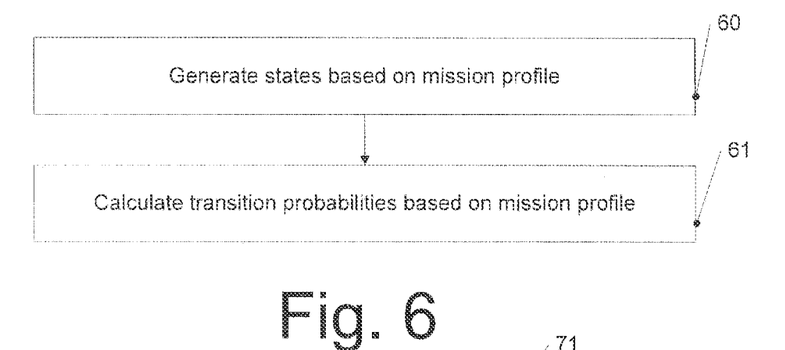
FIG. 6 is a flowchart illustrating a method according to an embodiment.
Figure 7A:
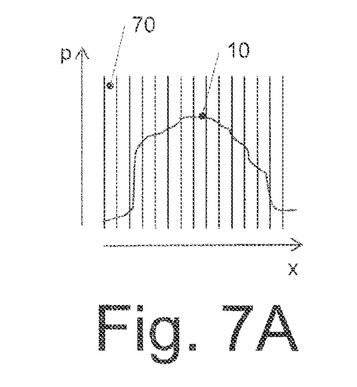
FIGS. 7A and 7B are schematic examples illustrating the generation of states based on a mission profile according to some embodiments.
Figure 7B:
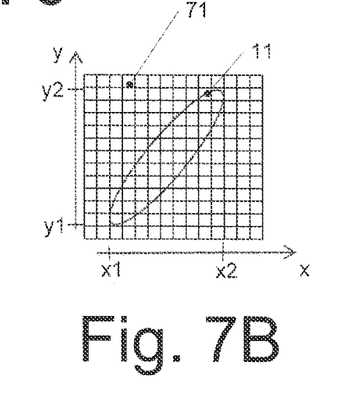
Figure 8:
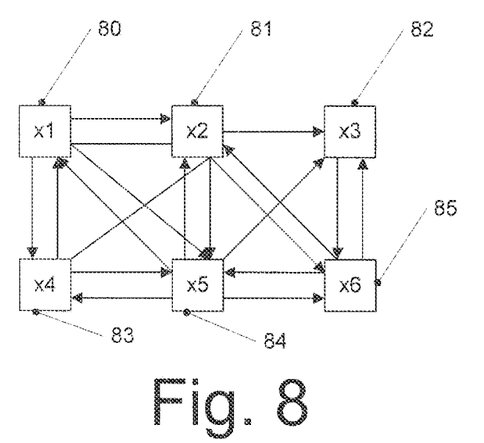
FIG. 8 illustrates a simple example for a finite state machine according to an embodiment.

Next, the generation of finite state machines based on mission profiles will be illustrated in some more detail with reference to FIGS. 6-8.

In FIG. 6, a method to generate finite state machines based on mission profiles according to an embodiment is schematically illustrated. The method of FIG. 6 may for example be used to implement the generation of a finite state machine at 51 in FIG. 5 or may be used in the implementation of finite state machine generation modules 31 or 41 of FIGS. 3 and 4, respectively. Other techniques may also be used.

At 60, in FIG. 6 the method comprises generating states based on a mission profile. For generating states, cluster algorithms like k-means clustering, DBSCAN (density-based spatial clustering of applications with noise) or an EM (expectation maximization) algorithm may be used. Other techniques may be used as well. Two simple examples for generating states based on a mission profile are furthermore illustrated in FIGS. 7A and 7B.

In FIG. 7A, the mission profile discussed with reference to FIG. 1A is used as an example mission profile, i.e. a probability distribution of a parameter x represented by curve 10. To generate states, a total range for parameter x is divided into a plurality of bins 70, each bin 70 being limited by two vertical lines in the representation of FIG. 7A. In other words, each bin corresponds to a specific sub-range of the parameter x. As a simple example, if the probability for x would be greater than 0 for a total range of x from 1 to 10, a first bin could correspond to values of x from 1 (included) to 2 (excluded), a second bin to the range of x from 2 (included) to 3 (excluded) etc., just to give an example. It should be noted that the sub-ranges need not have the same size. Each bin 70 then corresponds to one state.

As a further example, in FIG. 7B the mission profile discussed with reference to FIG. 1B, i.e. a correlation between parameters x and y described by curve 11, is used as an example. To generate states, for example a grid as shown for example in FIG. 7B may be applied to curve 11, each square 71 of the grid representing a state. While squares are shown in FIG. 7B, other patterns, like rectangles or a hexagon-based grid, may also be used.

Returning to FIG. 6, at 61, the method of the embodiment of FIG. 6 comprises calculating transition probabilities between the states based on the mission profile. To calculate transition probabilities, for example directed calculation, iterative methods or computational intelligence methods like genetic algorithms (GA) or neuronal networks (NN) may be used. For example, in the case of FIG. 7A transitions towards states, i.e. bins 70, with a higher probability p may be assigned a higher transition probability than transition towards states with a low probability p according to curve 10. In the example of FIG. 7B, transitions towards states (squares 71) fully outside curve 11 may be assigned a probability of 0 (or those states may be deleted from the finite state machine), transitions towards states fully within curve 11 may be assigned a certain transition probability which may be equal for all such states, and transitions towards states which are only partially within curve 11 may assigned a correspondingly reduced transition probability, just to give a simple example. Other techniques may also be used.

In FIG. 8, a simple example of a state machine which may result from the application of the method discussed with reference to FIGS. 6 and 7 is shown. For illustration purposes, the state machine of FIG. 8 comprises six states 80-85. Transitions with non-zero transition probabilities are represented as arrows between the states. It should be noted that the number of six states and the transitions shown by the arrows serve merely as examples, and in other cases more states, less states and/or different transitions may apply. It is to be noted that also "transitions" from a state to itself with a non-zero probability may be used in some embodiments, indicating that there is a non-zero probability that a state remains unchanged.

Each state may have a value of one or more parameters associated therewith. As a simple example, states 80-85 may have parameter values x1-x6 associated therewith as shown in FIG. 8. To generate a transient stimulus (for example at 52 in FIG. 5 or in modules 32, 42 of FIGS. 3 and 4, respectively), one of the states, for example state 80, may be used as a starting point, and at each time step the state may be changed according to the transition probabilities given for the respective state machine. In each time step, a parameter value associated with the respective state (for example x1, ..., x6 in FIG. 8) may be applied as a test signal. It should be noted that while single parameter values are associated to the states, in the example of FIG. 8, also values for different parameters, for example value parameter pairs for a correlation like the one discussed with reference to FIGS. 1B and 7B, may be given (for example pairs (xn, yn) for parameters x and Y).

It should be noted that in cases where the mission profile already comprises states (for example as explained with reference to FIG. 1C), the generation of states at 60 may be omitted.

Figure 9:
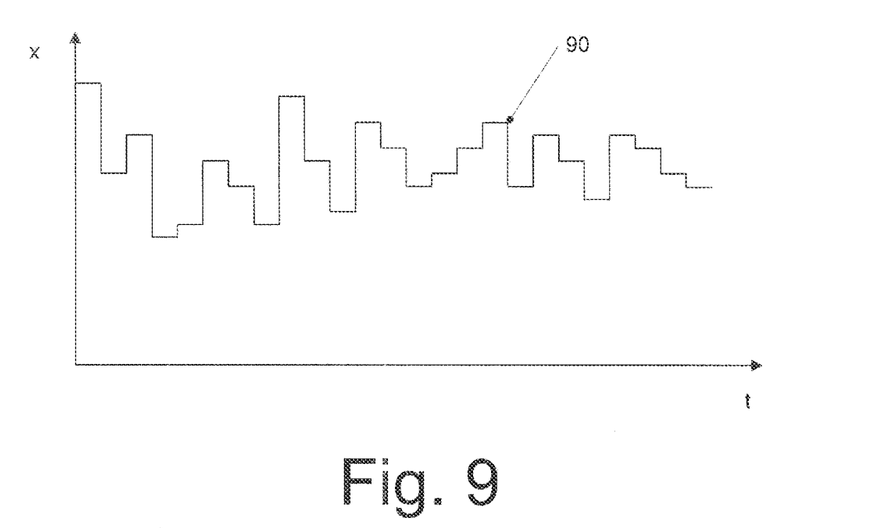
FIG. 9 is a diagram illustrating an example stimulus according to an embodiment.

To illustrate techniques further, in FIG. 9 a simple non-limiting example of a test stimulus generated using a finite state machine is shown. For example, at each time step as explained above the state of the state machine is changed based on the transition probabilities, and a value for a parameter x associated with the respective state is used as test stimulus, as illustrated by a curve 90. In embodiments, when for example a probability distribution as discussed with reference to FIGS. 1A and 7A is used as a mission profile, for long times t a distribution of values x for parameter x approximate the probability distribution.

Figure 10:
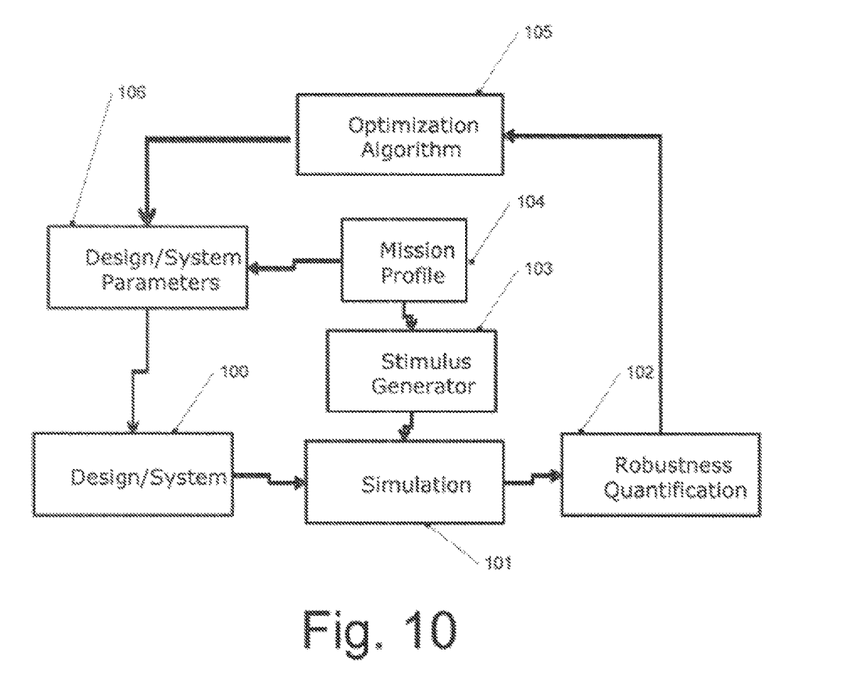
FIG. 10 is a diagram illustrating techniques according to an embodiment.

As already mentioned, test stimuli generated by techniques disclosed herein may be used for testing and/or optimization of devices like semiconductor devices or systems involving semiconductor devices. An exemplary embodiment illustrating optimization using techniques disclosed herein is shown in FIG. 10. For example, based on a mission profile 104 and optionally other information received e.g. from a customer, initial design/system parameters 106 are determined, for example using conventional semiconductor device design methodology. Based on these parameters, a description 100 of the device, e.g. a system, is provided. Furthermore, based on mission profile 104, a stimulus generator 103 generates test stimuli, for example as described above by generating a finite state machine based on the mission profile and then generating test stimuli based on the finite state machine. Based on the description 100 and the test stimuli generated by stimulus generator 103, at 101 a simulation of the design is performed. For simulating, any conventional techniques used in semiconductor device developments may be used, for example conventional commercially available EDA programs (electronic design automation).

In an embodiment, at 102 based on the simulation the robustness of the design is quantified using an appropriate metric for the design. In some embodiments, a worst case distance (WCD) is used as a metric. For a complete system comprising a plurality of components, as worst case distance for the whole system a minimum of worst case distances for all components may be used. Other metrics or criteria for evaluating the simulation results may also be used. If the results, for example the robustness, is satisfying, for example fulfils the requirements, the design may be used for implementing the semiconductor device (and for example then further tests with actual prototypes may be performed). If this is not the case, at 105 an optimization algorithm may be applied to the system. Any conventional optimization algorithm may be used. For example, in a simple case a design parameter may be varied in a direction. After applying the optimization parameters, updated design/system parameters 106 result, and the above-described techniques may be provided to obtain a new robustness quantification at 102. If the new robustness for example is better than the previous robustness, the change of design parameters may be kept and further variations may be performed to further optimize the design. If the robustness worsened, the change of design parameters performed by optimization algorithm 105 may for example be reversed, and a design parameter may be varied in an opposite direction. In other embodiments, a binary search for an optimized parameter may be used as optimization algorithm.

The various techniques described with reference to FIG. 10 may for example be implemented as software running on a computing system as for example illustrated with respect to FIG. 2, but may also be partially or fully implemented in hardware, firmware or any combinations of hardware, firmware and software.

Generally, the techniques described herein may be integrated in existing EDA tools, hardware equipment or other appropriate equipment.

Figure 11:
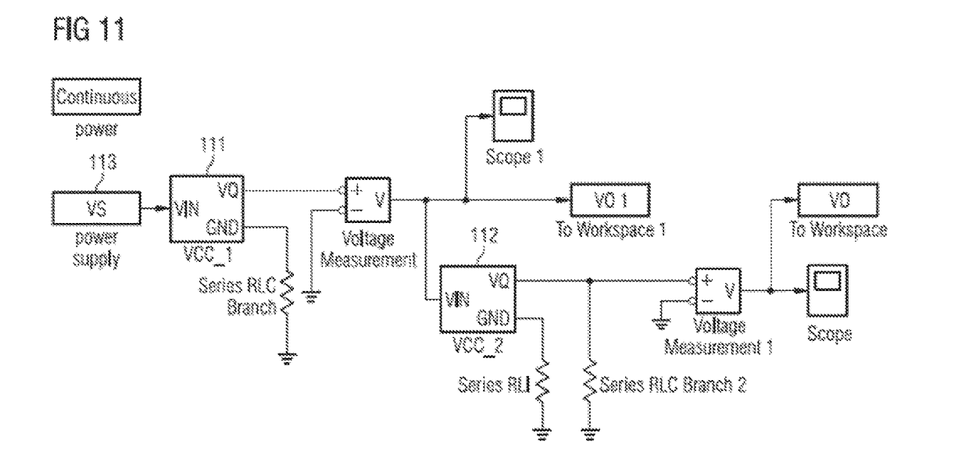
FIG. 11 illustrates an example circuit.

To illustrate the optimization of FIG. 10 further, in FIG. 11 a simple example of a circuit to be optimized which was used in a test optimization is shown. This circuit merely serves illustration purposes and is not to be construed as limiting. In particular, techniques disclosed herein may be applied to any devices, including systems with a plurality of components. In the example of FIG. 11, a circuit comprising a first voltage regulator 111 and a second voltage regulator 112 as post regulator is shown. As an optimization algorithm, a simple binary search in one dimension with only one free design parameter was used. As design parameters, a line regulation of the regulators 111, 112 with an area constraint (i.e. an area usable on a chip) as a side condition was used. As statistical parameters, a spread of a line regulation of regulators 111, 112 was used in a simulation. As mission profile, uniform, Gaussian and skewed hypothetical mission profiles were used for simulation purposes to describe a distribution for an input voltage VS at 113.

Figure 12A:
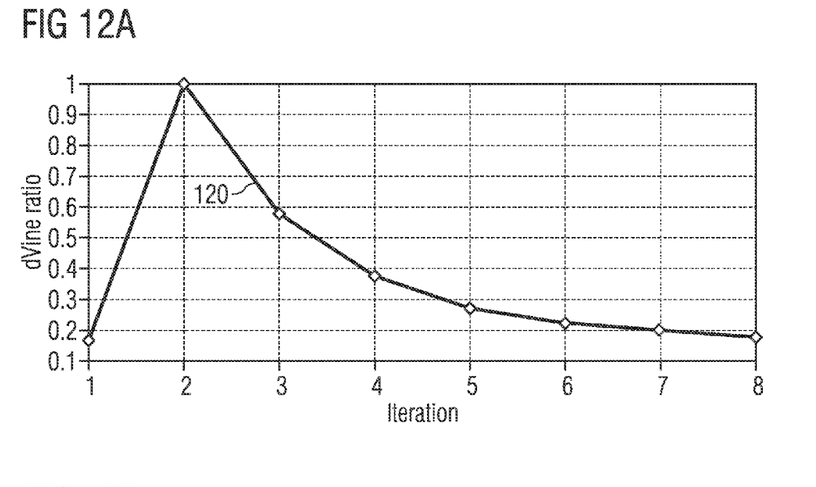
FIGS. 12A and 12B show illustrative examples of applying techniques according to embodiments to the circuit of FIG. 11.
Figure 12B:
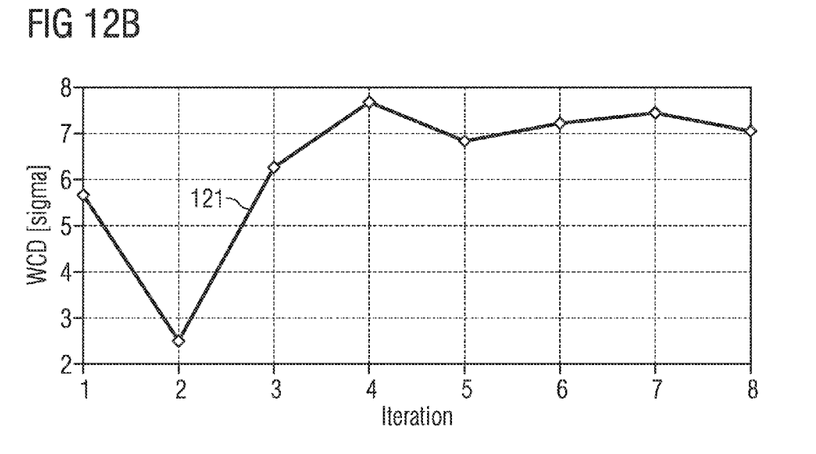

As robustness quantification metric, the above-mentioned worst case distance was used based on simulated variations of an output voltage VQ of regulator 112 in response to test stimuli generated based on the mission profiles. In FIG. 12A, an example of the design parameter (line regulation) for regulators 111, 112 for iterations 1-8 are shown in a curve 120, and in FIG. 12B a curve 121 shows values for the robustness metric for the iteration. As shown, after 8 iterations at a specific value of the line regulation a high robustness is obtained. It should be noted that FIGS. 11 and 12 serve only to illustrate the functioning of FIG. 10 using a simple circuit example, and are not to be construed as limiting in any way. It should also be noted that in other embodiments, no optimization is performed, but merely a testing of a design or device under test to check if the design or device under test meets given requirements may be performed. Therefore, the above-described embodiments are to be considered only simple examples and are not to be construed as limiting.

What is claimed is:

1. A method, comprising:
   generating a finite state machine based on one or more mission profiles associated with one or more semiconductor devices or a system of interacting semiconductor devices, wherein the mission profiles comprise information associated with one or more parameters to be applied to the respective semiconductor device or system of interacting semiconductor devices, wherein generating the finite state machine comprises generating states based on the mission profiles, and wherein each state comprises one or more parameter values of the one or more parameters to be applied to the respective semiconductor device or system of interacting semiconductor devices;
   generating test stimuli for the semiconductor devices or interacting semiconductor devices based on running the finite state machine, wherein the test stimuli correspond to the parameter values included in the states;
   outputting the test stimuli; and
   applying the output test stimuli as one or more signals to the one or more semiconductor devices or system of interacting semiconductor devices.

2. The method of claim 1, further comprising calculating transition probabilities between the states based on the mission profiles.

3. The method of claim 2, wherein generating the states comprises applying a cluster algorithm.

4. The method of claim 2, wherein calculating transition probabilities comprises one or more of a direct calculation, an iterative calculation or the application of a computational intelligence method.

5. The method of claim 1, wherein the mission profiles further comprise states, and generating the finite state machine further comprises generating the finite state machine based on a plurality of transition probabilities between the states of the mission profiles.

6. The method of claim 1, wherein generating the test stimuli comprises applying a stochastic process to the finite state machine.

7. The method of claim 1, wherein generating the test stimuli comprises applying a directed process to the finite state machine.

8. The method of claim 1, further comprising at least one of validating, verifying or testing the semiconductor devices or system of interacting semiconductor devices using the test stimuli.

9. The method of claim 8, wherein the at least one of validating, verifying or testing comprises simulating the semiconductor devices or system of interacting semiconductor devices using the test stimuli.

10. The method of claim 9, further comprising optimizing a design of the semiconductor devices or system of interacting semiconductor devices based on the at least one of validating, verifying or testing.

11. The method of claim 10, wherein the optimizing comprises evaluating a robustness of the semiconductor devices or system of interacting semiconductor devices, and changing the design parameters to increase robustness.

12. The method of claim 1, wherein the information of the mission profiles comprises a correlation between at least two parameters associated with the respective semiconductor device or the respective system of interacting semiconductor devices.

13. The method of claim 1, wherein the one or more parameters to be applied to the respective semiconductor device or system of interacting semiconductor devices comprise at least one of a temperature, a voltage, a current, or a magnetic field.

14. The method of claim 1, wherein the information of the mission profiles comprises a probability distribution of a parameter associated with the respective semiconductor device or the respective system of interacting semiconductor devices.

15. An apparatus, comprising:
   a finite state machine generation module to generate a finite state machine based on one or more mission profiles associated with one or more semiconductor devices or a system of interacting semiconductor devices, wherein the mission profiles comprise information associated with one or more parameters to be applied to the respective semiconductor device or system of interacting semiconductor devices, and wherein generating the finite state machine comprises generating states based on the mission profiles, and wherein each state comprises one or more parameter values of the one or more parameters to be applied to the respective semiconductor device or system of interacting semiconductor devices, a stimuli generation module to generate test stimuli for the semiconductor devices or system of interacting semiconductor devices based on running the finite state machine and output the test stimuli, wherein the test stimuli correspond to the parameter values included in the states, and at least one of a verification module, a test module or a test device to at least one of verify, validate or test the semiconductor devices or system of interacting semiconductor devices using the test stimuli, wherein the test stimuli are applied as one or more signals to the one or more semiconductor devices or system of interacting semiconductor devices.

16. The apparatus of claim 15, wherein the finite state machine generation module is further configured to calculate transition probabilities between the states based on the mission profiles.

17. The apparatus of claim 15, wherein the mission profiles further comprise at least one of a probability distribution of a parameter or a correlation between at least two parameters associated with the respective semiconductor device or the respective system of interacting semiconductor devices.

18. An apparatus comprising a processor and a memory, the memory containing instructions executable by the processor whereby the apparatus is operative to:

generate a finite state machine based on one or more mission profiles for one or more semiconductor devices or a system of interacting semiconductor devices, wherein the mission profiles comprise information associated with one or more parameters to be applied to the respective semiconductor device or system of interacting semiconductor devices, and wherein generating the finite state machine comprises generating states based on the mission profiles, and wherein each state comprises one or more parameter values of the one or more parameters to be applied to the respective semiconductor device or system of interacting semiconductor devices;

generate test stimuli for the semiconductor devices or system of interacting semiconductor devices based on running the finite state machine, wherein the test stimuli correspond to the parameter values included in the states;

output the test stimuli; and apply the output test stimuli as one or more signals to the semiconductor devices or system of interacting semiconductor devices.

19. The apparatus of claim 18, wherein generating the finite state machine further comprises calculating transition probabilities between the states based on the mission profiles.

20. The apparatus of claim 19, wherein calculating transition probabilities comprises one or more of a direct calculation, an iterative calculation or the application of a computational intelligence method.

21. The apparatus of claim 18, wherein the mission profiles comprise states, and generating the finite state machine further comprises generating the finite state machine based on a plurality of transition probabilities between the states of the mission profiles.

22. The apparatus of claim 18, wherein generating the test stimuli comprises applying a stochastic process to the finite state machine.

* * * * *